(12) United States Patent
Blair et al.

(10) Patent No.: US 7,728,671 B2
(45) Date of Patent: Jun. 1, 2010

(54) SEMICONDUCTOR POWER DEVICE WITH BIAS CIRCUIT

(75) Inventors: Cynthia Blair, Morgan Hill, CA (US);
Prasanth Perugupalli, Basking Ridge, NJ (US)

(73) Assignee: Infineon Technologies AG, Neubiberg (DE)

( * ) Notice: Subject to any disclaimer, the term of this patent is extended or adjusted under 35 U.S.C. 154(b) by 192 days.

(21) Appl. No.: 12/015,890

(22) Filed: Jan. 17, 2008

(65) Prior Publication Data

US 2009/0184756 A1 Jul. 23, 2009

(51) Int. Cl.
*H03F 1/26* (2006.01)
(52) U.S. Cl. ........................... 330/290; 330/307
(58) Field of Classification Search .................. 330/296, 330/307, 290
See application file for complete search history.

(56) References Cited

U.S. PATENT DOCUMENTS 7,288,992 B2 * 10/2007 Birkbeck .................... 330/296
7,564,303 B2 * 7/2009 Perugupalli et al. ........... 330/66

OTHER PUBLICATIONS

Curtice, W. et al., "New LDMOS Model Delivers Powerful Transistor Library—Part 1: The CMC Model," High Frequency Electronics, Oct. 2004, pp. 18-25.
Wood, S. et al., "New LDMOS Model Delivers Powerful Transistor Library—Part 2: Library Applications," High Frequency Electronics, Nov. 2004, pp. 26-33.

* cited by examiner

*Primary Examiner*—Steven J Mottola
(74) *Attorney, Agent, or Firm*—Coats & Bennett, P.L.L.C.

(57) ABSTRACT

An RF power circuit comprises a power transistor having a gate and drain, an output matching network coupled to the drain and an input matching network coupled to the gate. A closed-loop bias circuit is integrated with the power transistor on the same die and coupled to the gate for biasing the RF power transistor based on a reference voltage applied to the bias circuit.

24 Claims, 6 Drawing Sheets

SEMICONDUCTOR POWER DEVICE WITH BIAS CIRCUIT

BACKGROUND

Lateral diffused metal-oxide-semiconductor (LDMOS) transistors provide for excellent power performance and linearity and are therefore often the transistor of choice in Radio frequency (RF) power devices in applications in the GHz range and microwave range. LDMOS transistors, thus, have begun in the past few years to dominate cellular base station applications. Linearity is provided by properly biasing these devices. Typically, these devices are operated in the so-called "AB" mode which requires proper setting of the gate voltage to achieve a desired quiescent current. In conventional circuits, this is often done by a simple potentiometer with or without temperature and/or hot electron compensation. However, incorporating a simple potentiometer with an LDMOS transistor is not feasible in cost-effective high volume manufacturing.

SUMMARY

An RF power circuit comprises a power transistor, output and input matching networks and a closed-loop bias circuit. The power transistor has a gate and drain. The output matching network is coupled to the drain and the input matching network is coupled to the gate. The closed-loop bias circuit is integrated with the power transistor on the same die and coupled to the gate for biasing the RF power transistor based on a reference voltage applied to the closed-loop bias circuit.

BRIEF DESCRIPTION OF THE DRAWINGS

The present invention is better understood by reading the following description of non-limiting embodiments with reference to the attached drawings which are briefly described as follows.

It is to be noted, however, that the appended drawings illustrate only a few aspects of certain embodiments of this invention and are therefore not limiting of its scope, as the invention encompasses equally effective additional or equivalent embodiments.

DETAILED DESCRIPTION

Figure 1:
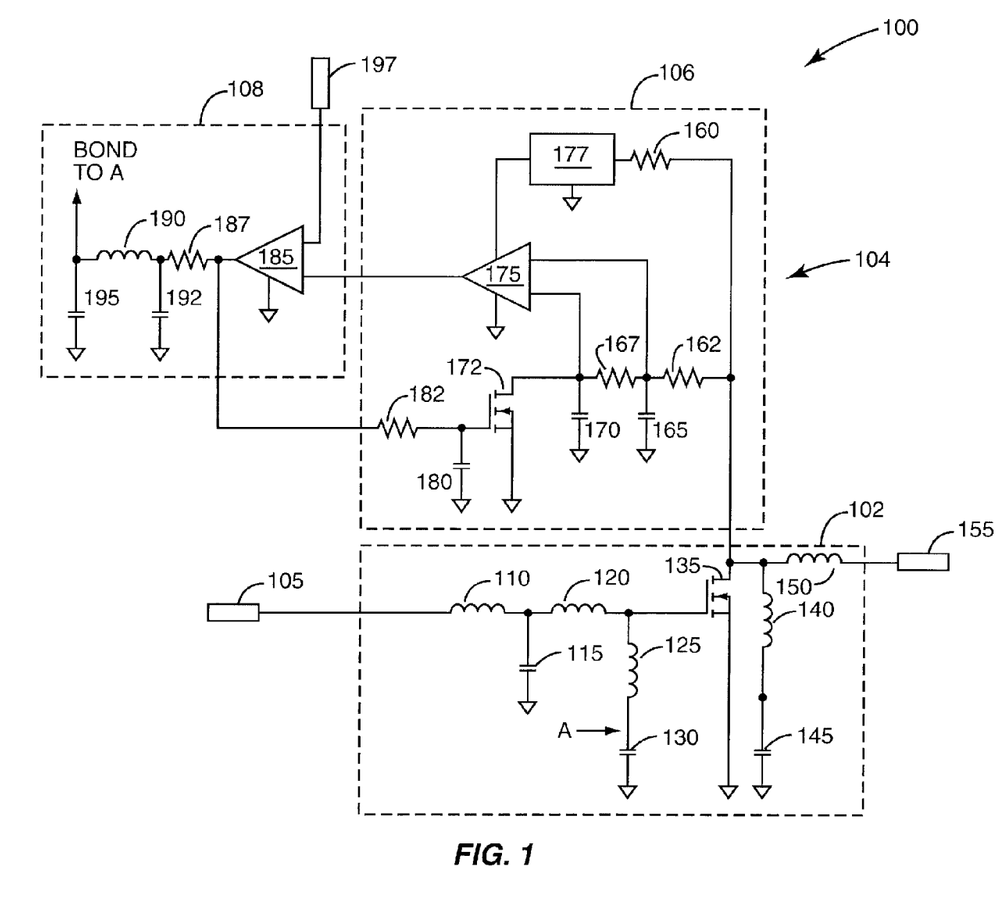
FIG. 1 shows an embodiment of an RF power circuit having a closed-loop bias circuit.

FIG. 1 shows an embodiment of an RF power circuit 100 having a power transistor section 102 and a closed-loop reference bias circuit 104. In one embodiment, the closed-loop bias circuit 104 includes a sense section 106 and an output section 108. The power transistor section 102 includes a power transistor 135 which can be, in one embodiment, a vertical LDMOS transistor whose load path is coupled on one hand to ground and on the other hand to transmission line 155. FIG. 1 shows input and output matching networks within a housing (not shown) coupled between external transmission lines 105 and 155 and the transistor 135, respectively. In one embodiment, the transmission lines 105 and 155 are typically $\lambda/4$ transmission lines. In one embodiment, the broken lines indicate the elements which are typically located inside the transistor housing. In one embodiment, the input matching network comprises two capacitors 115 and 130. One terminal of capacitors 115 and 130 is coupled to ground while the other terminal is interconnected by bond wires. To this end, the transmission line 105 is coupled by a bond wire 110 to capacitor 115 which is connected with the gate of transistor 135 by another bond wire 120. The gate of transistor 135 is also coupled to the other terminal of capacitor 130 via bond wire 125. In one embodiment, the output matching network may include one capacitor 145 coupled between ground and the drain of transistor 135 via bond wire 140. The drain of transistor 135 is also coupled to transmission line 155 via another bond wire 150. All bond wires shown in FIG. 1 operate as inductances in the targeted frequency operation range and are therefore depicted as such. Other parasitic characteristics of the bond wires or other components are not shown in FIG. 1 for sake of clarity.

In one embodiment, the closed-loop reference bias circuit 104 is coupled to the drain of transistor 135, as for example, shown in FIG. 1. An isolation resistor 162 coupled in series with a sense resistor 167 couples the drain of transistor 135 with the drain of another transistor 172. Transistor 172 is of the same type as power transistor 135, however, in one embodiment, transistor 172 may be scaled to represent, for example, approximately $1/n^{th}$ of the total gate width of power transistor 135. In one embodiment n can be set to 480. Sense resistor 167 is coupled to ground via capacitors 170 and 165, respectively. Also, the signal across sense resistor 167 is fed to the inputs of an operational amplifier 175. The drain of transistor 135 is also coupled via resistor 160 to an optional regulator circuit 177 whose output may provide a supply voltage to operational amplifier 175. The output of operational amplifier 175 is fed to the inverting input of a second operational amplifier 185. The non-inverting input of operational amplifier 185 is coupled to a third external terminal 197. The output of operational amplifier 185 is coupled via resistor 182 with the gate of transistor 172. The gate of transistor 172 is also coupled to ground via a capacitor 180. Furthermore, the output of operational amplifier 185 is connected to a capacitor 192 which on the other hand is grounded. The capacitor 192 is also coupled to another capacitor 195 in parallel via a bond wire 190. Furthermore, the connection between bond wire 190 and capacitor 195 is coupled to the connection between bond wire 125 and capacitor 130 as indicated by coupling point "A" in FIG. 1.

Figure 6:
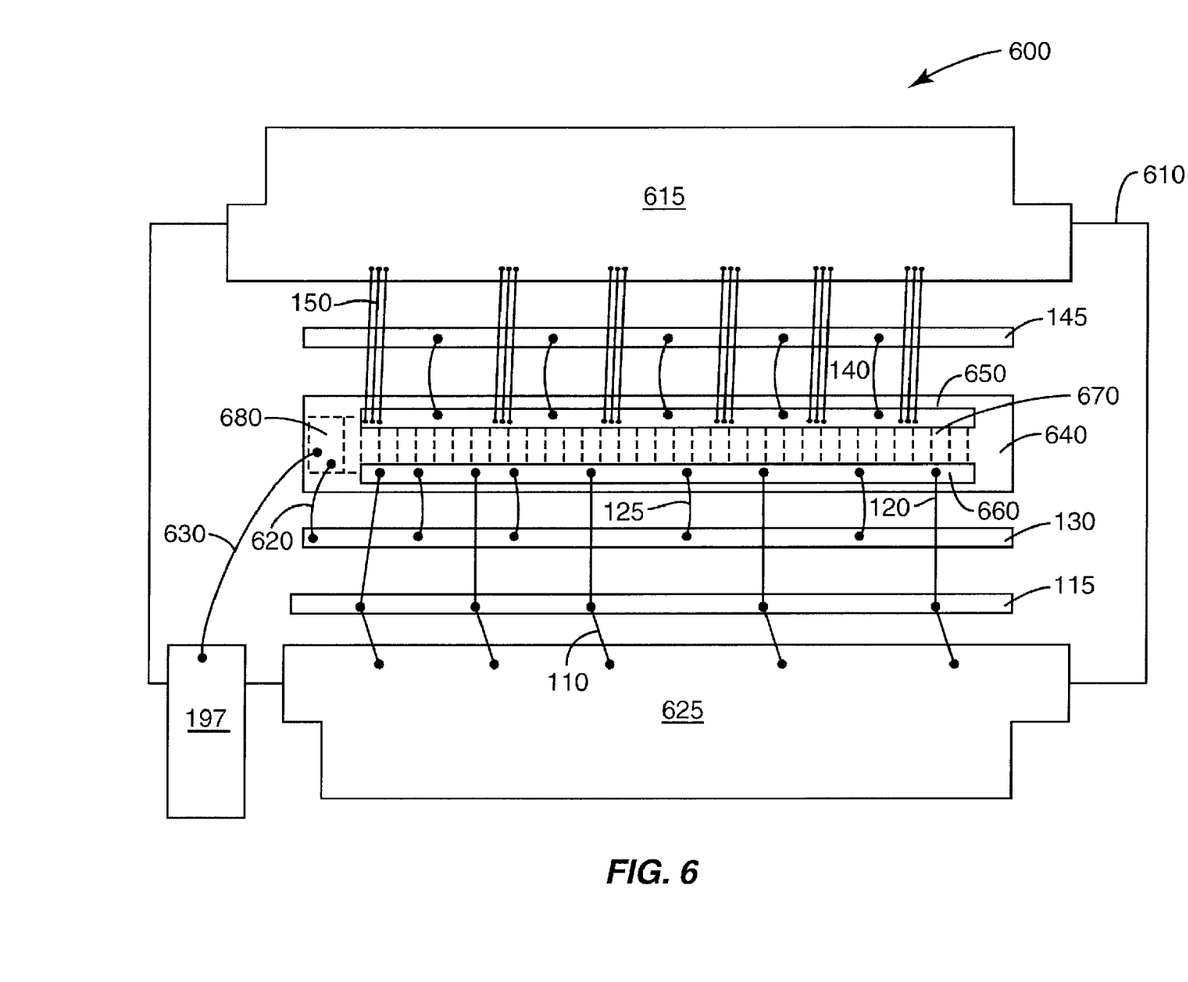
FIG. 6 shows a plan view of an embodiment of a transistor package using the RF power circuit according to FIGS. 1 or 2.

FIG. 6 shows a plan view of an embodiment of a power transistor device assembly 600 including the RF power circuit 100. For a better understanding, similar elements have the same reference numerals. The device assembly 600 comprises a semiconductor die 640, including the RF power circuit 100, arranged on a substrate 610. The power transistor section 102 of the RF power circuit 100 is represented in part by drain terminal 650, gate terminal 660 and active zone 670. Furthermore, in one embodiment, on the left side of the semiconductor die 640, the closed-loop reference bias circuit 104 portion of the RF power circuit 100 is arranged within an area 680. The bond wire connection to connection node "A" (in FIG. 1) is denoted with numeral 620. The coupling between the input of operational amplifier 185 and the extra terminal 197 is denoted with numeral 630. In one embodiment, the bond wire connection between a first terminal 615 of the assembly 600 and drain 650 is provided for by a plurality of bond wires 150 coupled in parallel to reduce the resistance. Similarly, the bond wire connection between a second terminal 625 of the assembly 600 and gate 660 is also provided for by a plurality of bond wires 110/120. In one embodiment, the first terminal 615 corresponds to transmission line 155 and the second terminal 625 corresponds to transmission line 105. Most other bond wire connections can also be implemented by multiple bond wires coupled in parallel as shown in the embodiment of FIG. 6. Also indicated in FIG. 6 is that the active zone 670 of power transistor 135 uses n-times the area of transistor 172 which is integrated within the area 680 of the die 640.

As mentioned above, in one embodiment, transistor 172 may be scaled to represent approximately $1/480^{th}$ of the total gate width of the power transistor 135 on the chip 640. Thus, in one embodiment, transistor 172 can be processed in exactly the same way as transistor 135. Hence, transistor 172 shares the same gate turn on characteristics as transistor 135. As can be seen in the embodiment shown in FIG. 1, transistor 172 is operated in a closed loop mode, e.g. at $1/480^{th}$ the quiescent current for transistor 135. In one embodiment, transistor 172 and, thus, the closed loop mode can be operated at a scaled quiescent current value with respect to transistor 135 (Class A). Hence, a sample of the gate voltage of transistor 172 will supply the gate voltage of transistor 135.

In one embodiment, isolation resistor 162 may be designed to be large enough to isolate the closed-loop reference bias circuit 104 from drain excursions formed by radio frequency and modulation. Sense resistor 167 forms the sense resistor which is evaluated by operational amplifier 175. In one embodiment, the value across sense resistor 167 should be controlled as closely as possible because the accuracy of the bias point depends on the current sensing it provides. In one embodiment, operational amplifier 175 is a differential amplifier that provides for a voltage which is directly proportional to the current drawn by sense resistor 167. The non-inverting input of operational amplifier 185 is supplied by a precision reference voltage which can be fed to the closed-loop bias circuit 104 via the external terminal 197.

Thus, a desired quiescent current through power transistor 135 can be externally adjusted. The inverting input is supplied by operational amplifier 175. Operational amplifier 185 compares the precision current measurement with the desired reference and provides for an output voltage that supplies the gates of transistors 175 and 135. Hence in one embodiment, operational amplifiers 175 and 185 and transistor 172 form a closed loop that reaches equilibrium when the reference voltage matches the sensed current through sense resistor 167. In one embodiment, the gate voltage for transistor 135 may be isolated by an RLC network 187, 192, 190, 195 and applied at coupling node "A" to the DC blocking capacitor 130 in the input shunt path of the input matching network of power LDMOS transistor 135. This may be a virtual RF "cold" point and in one embodiment, therefore, may be preferably used to feed the bias voltage to the gate of power transistor 135. In one embodiment, the regulator 177 provides a supply voltage to operational amplifiers 175, 185.

From the outside, a user will see that the RF power circuit 100 provides the same current when a reference voltage according to its specifications is applied to terminal 197. Temperature compensation and thermal velocity effects from hot carrier drifts are reduced to negligible levels as the device continually corrects itself in a closed loop mode.

Figure 2:
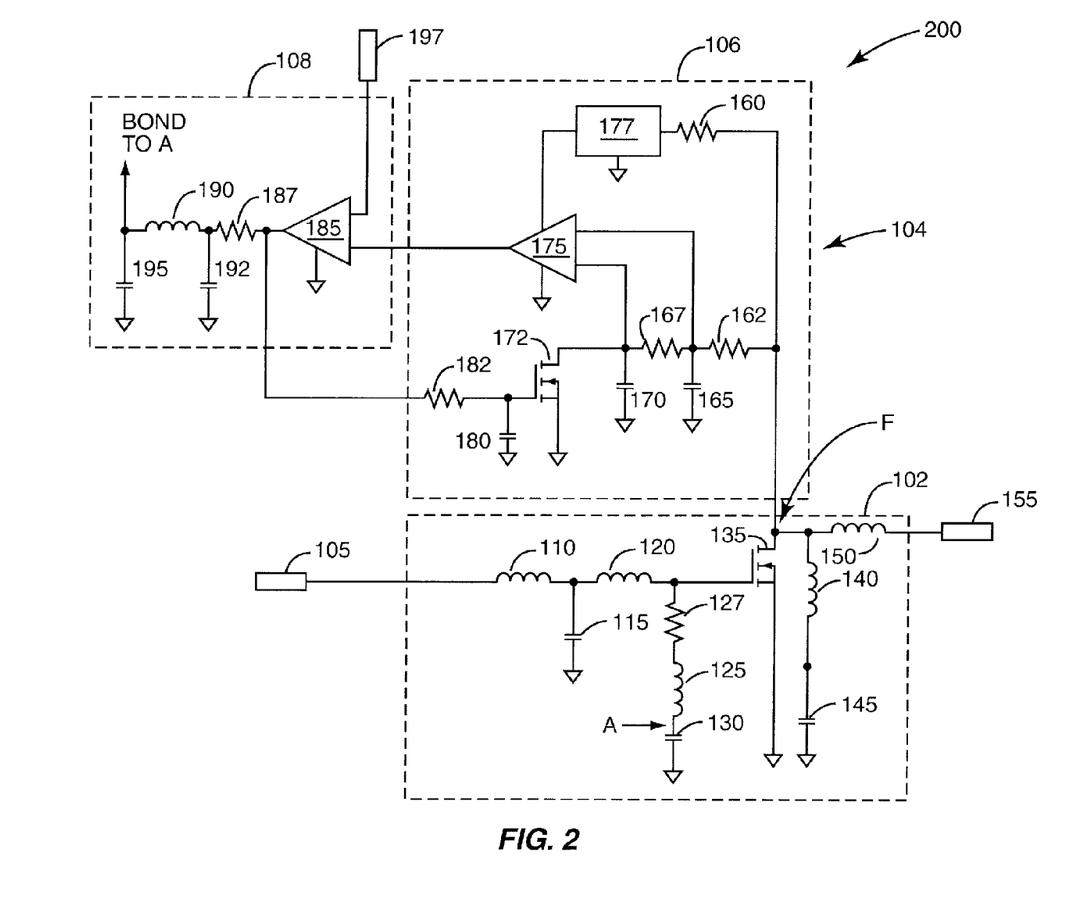
FIG. 2 shows another embodiment of an RF power circuit having a closed-loop bias circuit.

FIG. 2 shows another embodiment of an RF power circuit 200 where an additional resistor 127 is arranged in the shunt path of the power transistor 135. The resistor 127 is shown between the gate of transistor 135 and the bond wire 125, however, it could be also placed between the bond wire 125 and capacitor 130. All other elements are similar to the embodiment of FIG. 1. Thus, the bias voltage generated by the operational amplifier 185 is again input at the connection node "A" between the capacitor 130 and bond wire 125. Resistor 127 provides stability at low voltages, e.g., during turn-on of the circuit 200.

Figure 3:
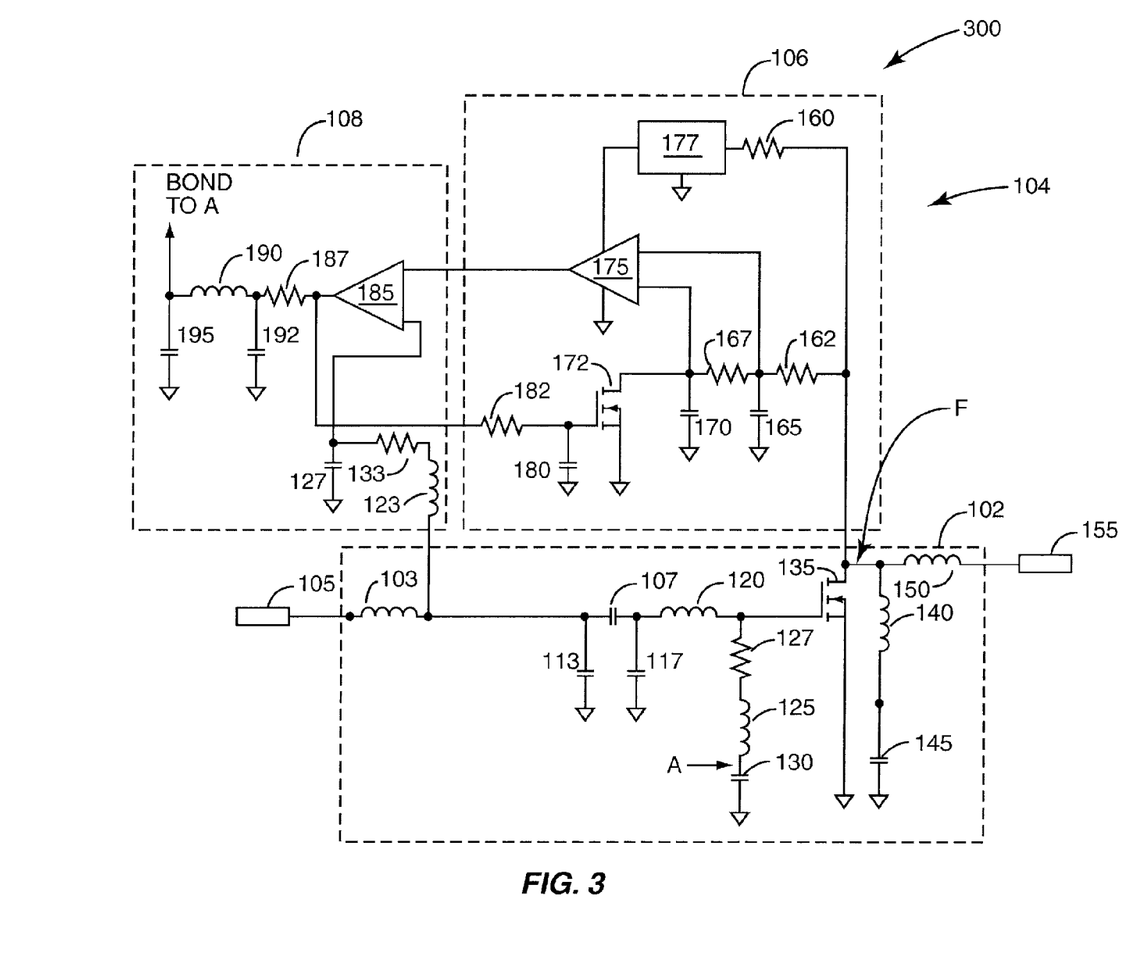
FIG. 3 shows yet another embodiment of an RF power circuit having a closed-loop bias circuit.

FIG. 3 shows yet another embodiment of an RF power circuit 300 where a different input matching network and a DC blocking feature are provided. Again, similar elements have the same reference numerals. According to this embodiment, the external terminal 197 is not needed to feed an external reference voltage to the closed-loop reference bias circuit 104. Instead, the reference voltage is applied to transmission line 105 which feeds the reference voltage to the bias circuit 104. In more detail, the input matching network of the power transistor section 102 includes three additional capacitors 107, 113, and 117. Capacitors 113 and 117 are grounded at one node and coupled together at the other node via capacitor 107. In some embodiments, the capacitors 113 and 117 may replace other elements of the matching network. In one embodiment, the node between capacitor 113 and 107 is coupled via bond wire 103 to the transmission line 105 whereas the node between capacitor 107 and 117 is coupled to bond wire 120 which is also coupled to the gate of transistor 135. The node between capacitor 113 and bond wire 103 is furthermore coupled via bond wire 123 with resistor 133 which is coupled to the non-inverting input of the operational amplifier 185. The non-inverting input of the operational amplifier 185 is also coupled to ground via capacitor 127. This arrangement obviates the need for the third external terminal 197 since transmission line 105 carries both the gate input for transistor 135 and the reference voltage.

Figure 7:
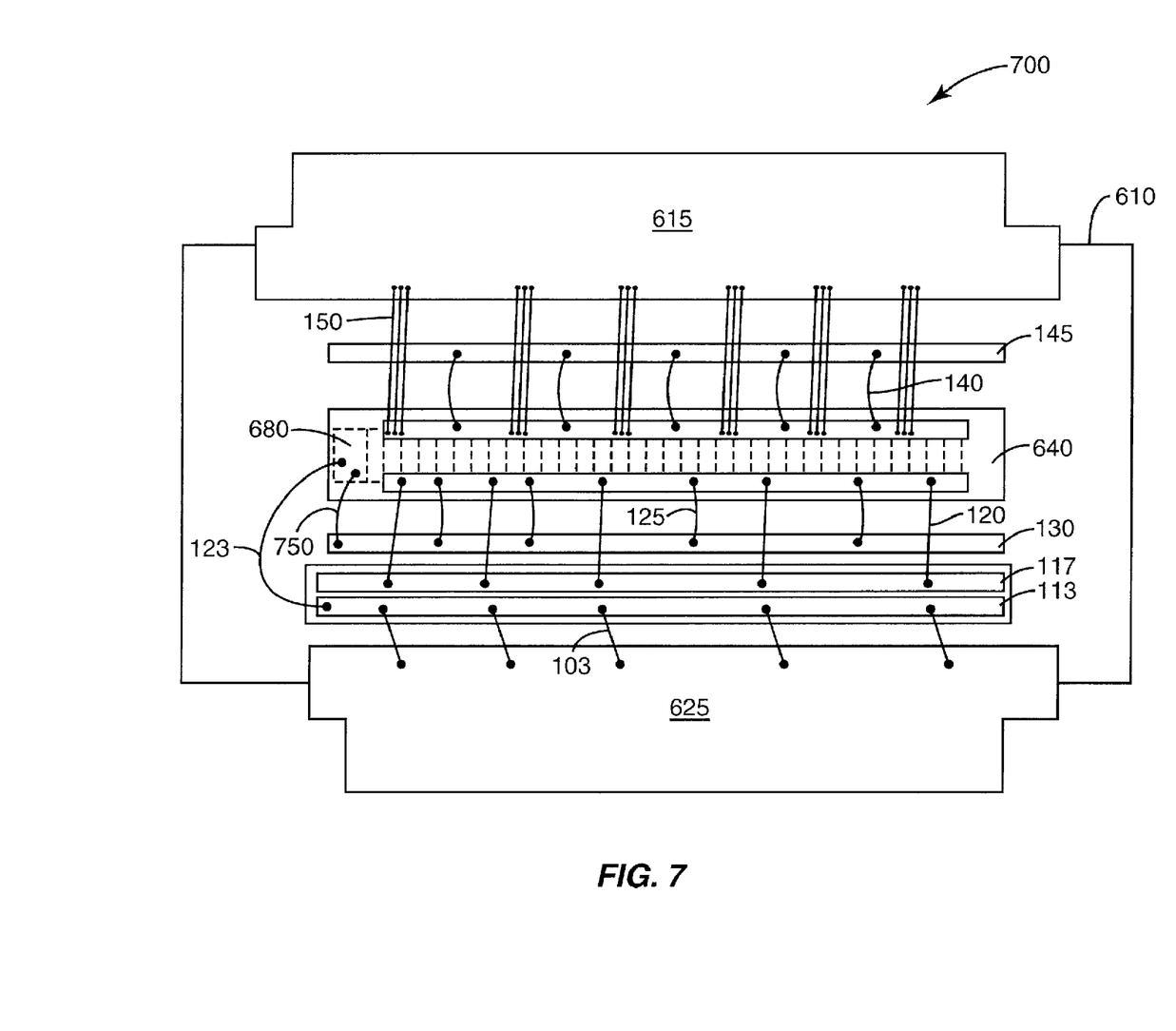
FIG. 7 shows a plan view of another embodiment of a transistor package using the RF power circuit according to FIG. 3.

FIG. 7 shows a plan view of an embodiment of a power transistor device assembly 700. FIG. 7 shows again similar numerals with respect to FIG. 6 for similar components. Capacitors 113 and 117 are in close proximity which allows in one embodiment for a realization of capacitor 107, for example, by means of a respective dielectric between the top electrodes of capacitors 113 and 117. Again, area 680 on the left side of semiconductor die 640 includes the closed-loop bias circuit 104 of the RF power circuit 300 as shown in the top area of FIG. 3. Bond wire 123 couples resistor 133 to the node between bond wire 103 and capacitor 113. Bond wire 750 is used to realize the coupling to node "A." In one embodiment, capacitor 115 of the RF power circuit 300 is split into two capacitors 113 and 117 which are coupled in parallel via a DC block capacitor 107. Thus, no additional pin is needed to apply the reference voltage to the closed-loop bias circuit 102. Instead, the second terminal 625 of the assembly 700 carries the reference voltage. In one embodiment, the second terminal 625 corresponds to transmission line 105.

The RF power circuit 300 does not have the external reference pin 197 included in the RF power circuit 200. However, the DC blocking capacitor 107 allows the reference voltage to be directly fed into transmission line 105 without adversely affecting operation of the RF power circuit 300. Mainly, the DC capacitor 107 prevents the reference voltage from reaching the gate of transistor 135.

In the illustrated embodiment, the RF power circuit 300 is internally biased in a closed-loop manner by the reference bias circuit 104. The reference voltage applied to the closed-loop bias circuit 104 is fed through the transmission line 105 instead of an additional external pin according to this embodiment. The RF power circuit 300 uses the same gate voltage, and thus, the circuit 300 is drift-less and has negligible performance variations over temperature.

Figure 4:
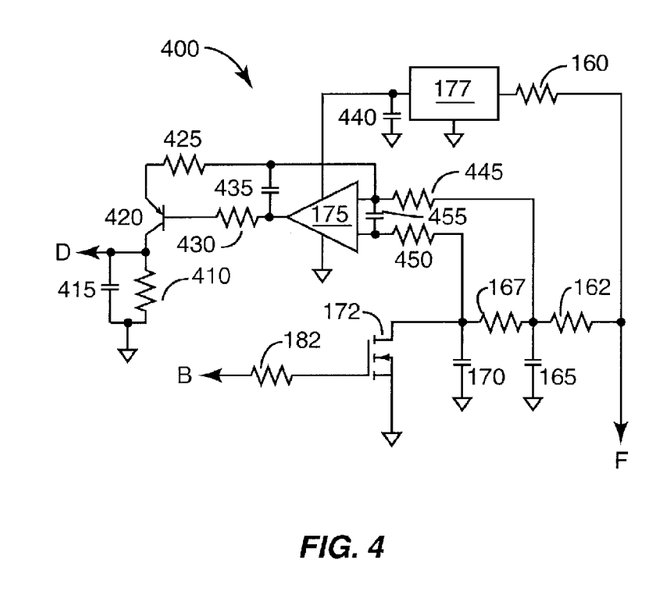
FIG. 4 shows an embodiment of a sense section of a closed-loop bias circuit.

FIG. 4 shows an embodiment of the sense section 106 of the closed-loop reference bias circuit 104. The sense section 400 according to this embodiment is but one possible implementation of the more general circuit 106 shown in FIGS. 1, 2 and 3. In one embodiment, resistors 445 and 450 couple sense resistor 167 with the inputs of operational amplifier 175. A capacitor 455 is placed between the inputs of operational amplifier 175. In one embodiment, an output circuit comprising transistor 420 with a feedback loop is provided for operational amplifier 175. The output of operational amplifier is coupled through resistor 430 with the base of transistor 420. The emitter of transistor 420 is coupled through resistor 425 to the inverting input of operational amplifier 175. Capacitor 435 is coupled between the inverting input and the output of operational amplifier 175. The collector of transistor 420 is coupled to ground via resistor 410 and parallel connected capacitor 415. The collector of transistor 420 also provides for the output "D" of the sense circuit 400. Regulator 177 provides for the supply voltage for all operational amplifiers and comprises an output capacitor 440.

In one embodiment, isolation resistor 162 is large enough to provide isolation while small enough to not provide enough of a voltage drop to affect the Vgs (gate-to-source voltage) turn on characteristics of transistor 172. For example, in one embodiment, the resistor 162 may have a value of 1 kΩ and sense resistor 167 a value of 500Ω. Operational amplifier 175 in conjunction with transistor 420 forms a current mirror. The output voltage of this current mirror is directly proportional to the current through sense resistor 167. In one embodiment, the regulator 177 of the sense circuit 400 is designed to provide any suitable voltage, if so required to maintain accuracy, for the operational amplifiers 175 and 185. The resistor network 445 and 450 is designed in one embodiment to be arranged directly in the operational amplifier 175. However, in other embodiments, a second pair of resistors (not shown) may be added to convert the inputs to the voltage dividers to distance them from the supply voltage. In one embodiment, all capacitors 165, 170, 415, 435, 440, and 455 may be designed to have a large capacitance as possible.

Figure 5:
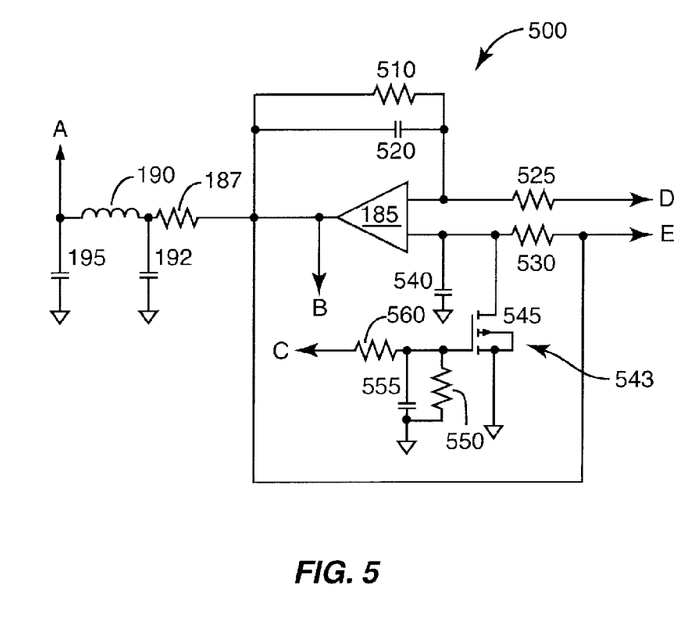
FIG. 5 shows an embodiment of an output section of a closed-loop bias circuit.

FIG. 5 shows an embodiment of the output section 108 of the closed-loop bias circuit 104. According to this embodiment of the output section 500, resistors 525 and 530 couple reference voltage inputs labeled as "D" and "E" to the operation amplifier 185, respectively. The coupling between the operational amplifier 175 and the reference input with operational amplifier 185 is performed via resistors 525 and 530, respectively. The output of operational amplifier 185 and its inverting input are coupled via parallel coupled resistor 510 and capacitor 520. The non-inverting input is coupled to ground via capacitor 540. Node "D" is coupled to the corresponding node shown in FIG. 4. Node "E" may be coupled to the external terminal 197, or in the embodiment shown in FIG. 3, to the transmission line 105.

The output section 500 may further comprise a start-up circuit 543 including MOSFET 545. The drain of MOSFET 545 is coupled to the non-inverting input of operational amplifier 185. The source of MOSFET 545 is coupled to ground, providing for a slow value of the output section 500 at start up. To this end, a resistor 550 and parallel coupled capacitor 555 couple the gate of MOSFET 545 to ground. The gate of MOSFET 545 is also coupled to node "C" via resistor 560. In one embodiment, node "C" is coupled to the high-side supply voltage of operational amplifier 185. Thus, node "C" may be coupled to the output of regulator 177. The output section 500 compares the sensed current output by the sense section 400 with the reference voltage. The operational amplifier 185 then generates a difference signal which is inversely proportional to the sensed current for biasing the gate of transistor 135.

The startup circuit 543 provides a low output value during startup to properly enable the output section 500. In one embodiment, transistor 545 in conjunction with resistor 530 and capacitor 540 form the startup circuit 543. According to this embodiment, the reference voltage at node "E" ramps up through resistor 530 and capacitor 540 after the regulator 177 reaches its operating voltage by turning off transistor 545 which initially shorts capacitor 540. The start-up circuit 543 may be used in one embodiment to protect the output section 500 against high currents if the drain voltage is toggled with the bias reference voltage.

Sense section 400 and output section 500 can be implemented using the standard semiconductor processes along with the main power transistor 135. For example, certain elements can be realized by parasitic elements as known by a person skilled in the art of integrated circuit technology. The area 680 of the semiconductor die 640 allocated to the closed-loop bias circuit 104 in FIGS. 6 and 7 may be relatively small as only a few components are necessary. As such, only a few additional process steps may be needed to realize all components of the closed-loop bias circuit 104 on the semiconductor die 640.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An RF power circuit, comprising:
   a power transistor having a gate and drain;
   an output matching network coupled to the drain;
   an input matching network coupled to the gate; and
   a closed-loop bias circuit integrated with the power transistor on the same die and coupled to the gate for biasing the power transistor based on a reference voltage applied to the closed-loop bias circuit, the closed-loop bias circuit including a sense circuit operable to sense an output current of the power transistor and an output circuit operable to bias the gate of the power transistor based on a difference between an output of the sense circuit and the reference voltage.

2. The RF power circuit according to claim 1, wherein the reference voltage is externally applied to the closed-loop bias circuit via an external terminal coupled to the closed-loop bias circuit.

3. The RF power circuit according to claim 1, wherein the sense circuit comprises:
   a resistor coupled between the drain and a further drain of a further transistor;
   a first operational amplifier having an input coupled to the resistor; and
   wherein the output circuit has an input coupled to an output of the operational amplifier and an output coupled to the gate of the power transistor.

4. The RF power circuit according to claim 3, wherein the output circuit comprises a second operational amplifier having a first input coupled to the output of the first operational amplifier and a second input that receives the reference voltage.

5. The RF power circuit according to claim 4, wherein an output of the second operational amplifier is coupled to a node of the input matching network.

6. The RF power circuit according to claim 1, wherein the sense circuit includes a start-up circuit operable to cause an output signal of the closed-loop bias circuit to ramp up when activating the RF power circuit.

7. The RF power circuit according to claim 6, wherein the start-up circuit comprises:
a transistor;
a capacitor charged via a resistor; and
wherein a load path of the start-up circuit transistor is coupled in parallel to the capacitor.

8. The RF power circuit according to claim 1, wherein the input matching network includes a capacitor arranged between an external transmission line and the gate, the closed-loop bias circuit is coupled to a node of the input matching network arranged between the transmission line and the capacitor, and the reference voltage is applied to the closed-loop bias circuit via the external transmission line.

9. The RF power circuit according to claim 8, wherein the capacitor is arranged between two shunt capacitors of the input matching network.

10. The RF power circuit according to claim 1, wherein the power transistor comprises a vertical MOS transistor.

11. The RF power circuit according to claim 1, further comprising a regulator coupled to the drain for generating a supply voltage for components of the closed-loop bias circuit.

12. An RF power device assembly, comprising:
a substrate;
a first terminal;
a second terminal;
a die including a power transistor having a gate and drain, the die being arranged between the first and second terminals on the substrate;
an input matching network arranged on the substrate between the second terminal and the gate; and
an output matching network arranged on the substrate between the drain and the first terminal, wherein the die further includes a closed-loop bias circuit coupled to the gate for biasing the power transistor based on a reference voltage applied to the closed-loop bias circuit, the closed-loop bias circuit including a sense circuit operable to sense an output current of the power transistor and an output circuit operable to bias the gate of the power transistor based on a difference between an output of the sense circuit and the reference voltage.

13. The assembly according to claim 12, wherein the first and second terminals comprise λ/4 transmission lines.

14. The assembly according to claim 12, further comprising a third terminal coupled to the closed-loop bias circuit for externally applying the reference voltage to the closed-loop bias circuit.

15. The assembly according to claim 12, wherein the input matching network comprises a capacitor arranged between the second terminal and the gate, wherein the closed-loop bias circuit is coupled to a node of the input matching network arranged between the second terminal and the capacitor for internally applying the reference voltage to the closed-loop bias circuit via the second terminal.

16. A method for manufacturing an RF power device assembly, comprising:
providing a substrate;
arranging on the substrate a die including a power transistor having a gate and drain and a closed-loop bias circuit for biasing the power transistor based on a reference voltage applied to the closed-loop bias circuit, the closed-loop bias circuit including a sense circuit for sensing an output current of the power transistor and an output circuit for biasing the gate of the power transistor based on a difference between an output of the sense circuit and the reference voltage;
arranging an output matching network adjacent to the die on the substrate;
arranging an input matching network adjacent to the die on the substrate; and
coupling different nodes of the power transistor, closed-loop bias circuit, and matching networks via bond wires.

17. The method according to claim 16, further comprising:
arranging a first terminal at least partly on the substrate;
arranging a second terminal at least partly on the substrate;
coupling the first terminal to the drain via bond wire couplings; and
coupling the second terminal to the gate via further bond wire couplings.

18. The method according to claim 17, wherein the output matching network is arranged between the die and the first terminal.

19. The method according to claim 17, wherein the input matching network is arranged between the die and the second terminal.

20. The method according to claim 16, wherein the input matching network comprises a capacitor, and the method comprises coupling the closed-loop bias circuit to a node of the input matching network arranged between the second terminal and the capacitor for internally applying the reference voltage to the closed-loop bias circuit through the second terminal.

21. The method according to claim 16, further comprising:
arranging a third terminal at least partially on the substrate; and
coupling the third terminal to the closed-loop bias circuit for externally applying the reference voltage to the closed-loop bias circuit.

22. A method of manufacturing a bias circuit for an RF power transistor, comprising:
integrating a closed-loop bias circuit on a power transistor die having a power transistor including a gate and drain, the closed-loop bias circuit including a sense circuit for sensing an output current of the power transistor and an output circuit for biasing the gate of the power transistor based on a difference between an output of the sense circuit and a reference voltage;
arranging the die on a substrate;
arranging an output matching network and an input matching network on the substrate; and
coupling different nodes of the closed-loop bias circuit, power transistor and matching networks via bond wires.

23. A method of using an RF power transistor, comprising:
coupling an output matching network to a drain of a power transistor;
coupling an input matching network to a gate of the power transistor;
coupling the gate and the drain to a closed-loop bias circuit integrated with the power transistor on the same die; and
biasing the gate based on a reference voltage applied to the closed-loop bias circuit the closed-loop bias circuit including a sense circuit for sensing an output current of the power transistor and an output circuit for biasing the gate of the power transistor based on a difference between an output of the sense circuit and the reference voltage.

24. The method according to claim 23, wherein coupling the gate and the drain to the closed-loop bias circuit comprises:
coupling the drain to the sense circuit; and
coupling the gate to the output circuit.

* * * * *